United States Patent [19]

Hennig

[11] Patent Number: 5,339,034

[45] Date of Patent: Aug. 16, 1994

[54] METHOD FOR OBSERVING TIME VARIATIONS OF SIGNAL INTENSITIES OF A NUCLEAR MAGNETIC RESONANCE TOMOGRAPHY IMAGE

[75] Inventor: Jürgen Hennig, Freiburg, Fed. Rep. of Germany

[73] Assignee: Bruker Medizintechnik GmbH, Rheinstetten, Fed. Rep. of Germany

[21] Appl. No.: 990,140

[22] Filed: Dec. 14, 1992

[30] Foreign Application Priority Data

Dec. 21, 1991 [DE] Fed. Rep. of Germany ....... 4142726

[51] Int. Cl.$^5$ .......................................... G01R 33/20
[52] U.S. Cl. ................................... 324/309; 324/307
[58] Field of Search .................... 324/309, 307, 312; 128/653.2

[56] References Cited

U.S. PATENT DOCUMENTS

| | | | |
|---|---|---|---|
| 4,721,912 | 1/1988 | Kaufman et al. | 324/309 |
| 4,914,727 | 4/1990 | Sano et al. | 324/307 |
| 4,973,111 | 11/1990 | Haacke et al. | 324/309 |
| 4,982,328 | 1/1991 | Kasugai | 324/309 |
| 5,003,264 | 3/1991 | Koizumi et al. | 324/312 |
| 5,168,226 | 12/1992 | Hinks | 324/309 |
| 5,184,074 | 2/1993 | Kaufman et al. | 324/309 |

OTHER PUBLICATIONS

Barkhuijsen, H., et al., "Retrieval of Frequencies, Amplitudes, Damping Factors, and Phases from Time-Domain Signals Using a Linear Least-Squares Procedure," J. Mag. Res., vol. 61 (1985), pp. 465–481. (no month).
Dietrich, W., et al., "A Simple Method for the Fitting of Baselines and Resonance Peaks in NMR Spectroscopy," J. Mag. Res., vol. 44 (1981), pp. 229–237. (no month).
Laue, E. D., et al., "Maximum Entropy Method in Nuclear Magnetic Resonance Spectroscopy," J. Mag. Res., vol. 62 (1985), pp. 437–452. (no month).
Pykett, I. L., et al., "Instant Images of the Body by Magnetic Resonance," Mag. Res. Med., vol. 5 (1987), pp. 563–671 (no month).
"Linear Prediction and Linear Predictive Coding," Chapter 12, Fourier Transform Spectral Methods, Section 10, Cambridge University Press, Cambridge England (1988), pp. 461–466. (no month).

*Primary Examiner*—Michael J. Tokar
*Assistant Examiner*—Raymond Y. Mah
*Attorney, Agent, or Firm*—LaRiviere & Grubman

[57] ABSTRACT

A method for obtaining a time sequence of nuclear magnetic resonance (NMR) tomograms of a certain sectional plane in a measuring volume for observation of variations with time of signal intensities from the sectional plane. The method where k data sets $f^k = f_1'^k \ldots f_n'^k$ are recorded for NMR-tomograms with a low spatial resolution characterized by a parameter n in a time sequence with a waiting time $t_w$ between the acquisition of each data set $f'^k$. The method where, in terms of time before k data sets $f'^k$, a data set $f = f_1 \ldots f_m$ is recorded for an NMR-tomogram of the same sectional plane with a high spatial resolution characterized by a parameter m (i.e. m$\gg$n). Subsequently, by means of said primarily recorded data set, new data sets $f^k$ are reconstructed from the successively recorded k data sets $f'^k$ for NMR-tomograms of the sectional plane with a high resolution in space and time. For almost simultaneous observation of transient proceedings, the method can be combined with three-dimensional NMR recordings instead of sectional images.

12 Claims, 2 Drawing Sheets

METHOD FOR OBSERVING TIME VARIATIONS OF SIGNAL INTENSITIES OF A NUCLEAR MAGNETIC RESONANCE TOMOGRAPHY IMAGE

TECHNICAL FIELD

The present invention relates to a method of obtaining a time sequence of nuclear magnetic resonance tomograms of a certain sectional plane in a measuring volume for observation of variations of signal intensities from the sectional plane. In the present invention, k data sets $f^k = f_1'^k \ldots f_n'^k$ are recorded for NMR-tomograms with a low spatial resolution. In the present invention, spacial resolution is characterized by a parameter n in a time sequence with a waiting time $t_w$ between the reception of each data set $f^k$.

BACKGROUND ART

Observation of variations with time of a nuclear magnetic resonance (NMR) image is important for an increasing number of clinical applications. For example, variation in time of contrastant intake is important for diagnosis of tumors as well as for perfusion studies. Also, by way of example, electrocardiogram dependent signal variations are used for characterizing processes which vary with the cycle of the heart.

A problem in observation of variations in time is the intrinsically low time resolution of image-producing NMR-tomography methods. Prior to the present invention, this problem was at least partially avoided by using extremely short measuring sequences. Methods used in this connection include echo planar imaging (described by Mansfield in J. Phys. C, 10, L55 (1977)) and very fast gradient echo sequences (described in A. Haase, Magn. Res. Med. 10, 135 (1989)). These methods are sufficiently fast only by using particular fast and strong magnetic field gradients. Image-recording times of less than 300 ms cannot be achieved with commonplace apparatus in this manner. In addition, the inherent short recording sequences often do not offer the image contrast which is relevant for the intended application.

DISCLOSURE OF THE INVENTION

Consequently, the present invention discloses a method for obtaining information about variation in time of NMR signal intensities with a very good spatial resolution in a very short time. Additionally, the present invention can be practiced with known means in the art of the present invention which comprise commonplace systems. Moreover, the present invention discloses a method which can be practiced by modifying known methods. According to the present invention, in terms of time before the k data sets $f^k$, a data set $f = f_1 \ldots f_m$ is recorded for an NMR-tomogram of the same sectional plane with a high spatial resolution characterized by a parameter m, where $m \gg n$. By means of this primarily recorded data set f, k new data sets $f'^k$ are reconstructed from the successively recorded k data sets $f^k$ for NMR tomograms of the sectional plane with a high resolution in space and in time. Spatial resolution, which is low at first, of NMR-tomograms from k data sets, which are recorded shortly one after the other, is considerably improved. Information about immovable structures of an observed sectional plane is known from a preceding sectional image recording with high spatial resolution and is afterwards integrated in the successively recorded k sectional images. Because k data sets were originally recorded with a low spatial resolution, a high chronological resolution can be achieved in near to the same time.

In some applications, it may be necessary to observe not only sectional images in a time-resolved manner but also the whole measuring volume in an almost simultaneous manner with respect to transient processes (diffusion, currents, motional proceedings, etc.). Wherein, storing and retrospective disintegration of data sets characterizing the volume in the form of sectional images is possible owing to modern computer technology. In which case, according to the present invention, a method of obtaining a time sequence of NMR images from a certain measuring volume, having k data sets $f^k$ for NMR recordings with a low spatial resolution recorded in each case, is modified in that, in terms of time before the k data sets $f^k$, one data set $f = f_1 \ldots f_m$ for an NMR recording of the same measuring volume is recorded with a high spatial resolution characterized by the parameter m and that, by means of said primarily recorded data set f, k new data sets $f'^k$ are reconstructed from the subsequently recorded k data sets $f^k$ for NMR recordings of the measuring volume with a high resolution in space and time.

The recording of NMR signals from an entire volume range is, of course, considerably slower than the primarily mentioned mere slice recordings of a certain sectional plane. For this reason the last-mentioned method will only be applied if the dynamic development is to be observed simultaneously everywhere in the measuring volume of interest, i.e., if the successive recording of "dynamic" sectional images of different sectional planes according to the first-mentioned method is not sufficient.

In the case of the preferred embodiment of the present invention, reconstruction of k new data sets $f''^k$ is effected by directly supplementing the primarily recorded data set $f = f_1 \ldots f_n, f_{n+1} \ldots f_m$ by the differing data set $\Delta f^k = f_1'^k - f_1 \ldots f_n'^k - f_n, 0, 0 \ldots$ for obtaining in each case k data sets $f''^k = f_1'^k \ldots f_n'^k, f_{n+1} \ldots f_m$ with a high resolution. Corresponding sectional images can be obtained by Fourier transformation.

With a more comprehensive calculation, the method according to the present invention can be practiced with the reconstruction of the k new data sets $f''^k$ as effected by application of "time-domain fitting", "frequency domain fitting" or some other generally known reconstruction algorithm, as for example, maximum entropy methods or "linear prediction".

In the case of the preferred embodiment of the present invention, gradient echo sequences are used as recording sequences. The method according to the present invention may also be carried out by using spin echo sequences or any other NMR recording sequences.

In the following, the present invention is further described and explained with reference to the embodiments shown in the drawing. The features which can be derived from the description and the drawing may be used in other embodiments of the invention individually or in any combination with one another.

Other features of the present invention are disclosed or apparent in the section entitled "Best Mode For Carrying Out The Invention."

BRIEF DESCRIPTION OF DRAWINGS

For fuller understanding of the present invention, reference is made to the accompanying drawing in the following detailed description of the Best Mode For Carrying Out The Invention.

Figure 1:
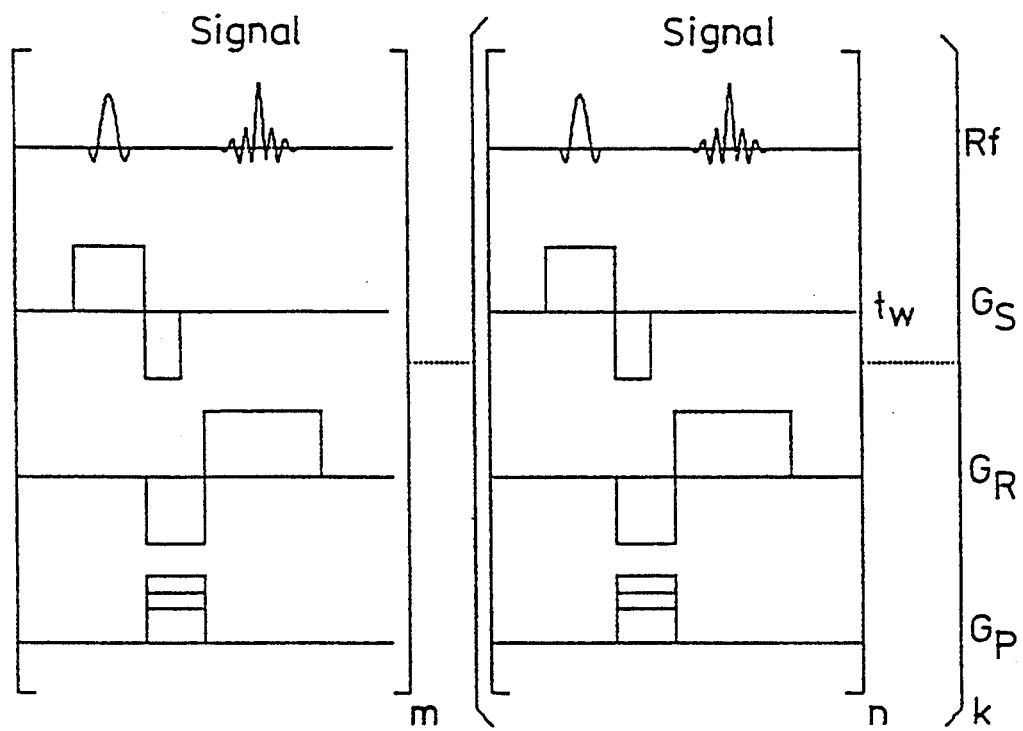
FIG. 1 shows a schematic representation of a method according to the present invention, wherein gradient echo sequences are used.

Reference numbers refer to the same or equivalent parts of the present invention throughout the several figures of the drawing.

BEST MODE FOR CARRYING OUT THE INVENTION

In accordance with the present invention, it should be understood that information about anatomic structures in a measuring volume and a sectional plane, respectively, which are observed may be obtained already before virtual measuring owing to recording of a conventional NMR image having a spatial high resolution. Thus, it is not necessary to carry out further recordings with a similar spatial resolution for measurement for observing signal variations within a known structure. It is rather sufficient to carry out those recording steps which contain essential information about signal intensities.

FIG. 1 is a schematic representation of a possible use according to the present invention, having a gradient echo sequence with an RF excitation pulse and an RF signal (Rf), slice selection gradient $G_S$, a read gradient $G_R$ and a phase gradient $G_P$. At first an image with high spatial resolution is recorded with m phase encoding steps, wherein m=256 corresponds to the present standard with respect to spatial resolution. Subsequently, only n phase encoding steps are used for a recording with high resolution with respect to time, wherein $n << m$. Phase encoding gradient $G_P$ values are thus selected such that an image of the same field of view (FOV) is generated, however, with a considerably smaller spatial resolution. A typical value is n=16 or 32. The acquisition of said reduced recording matrix is then repeated k−1 times after a waiting time $t_w$ in order to obtain k data sets $f^k$ which contain the dynamic development of the measuring area to be observed. Direct two-dimensional Fourier transformation of the reduced data sets produces images of a very low spatial resolution. By using previously recorded data with high spatial resolution with m phase encoding steps, k images with high spatial resolution may be reconstructed.

Back projection of low spatial resolution data can be effected according to different algorithms. The easiest way is directly supplementing the phase encoding steps required for the reconstruction from the data set with high resolution.

Let the phase encoding steps of the data set with high resolution be $f=f_1 \ldots f_m$, and those of the reduced k-th data set be $f^k=f_1'^k \ldots f_n'^k$. The data set $f'^k=f_1'^k \ldots f_{n+1} \ldots f_m$ produced by supplementation may be represented as sum of the original data set f with a differing data set $\Delta f^k=f_1'^k-f_1 \ldots f_n'^k-f_n, 0,0,0 \ldots$, where all projections of $\Delta f^k$, the index of which is bigger than n, equal zero. From the addition theorem of Fourier transformation, the Fourier transform may be represented as the sum of the original image F obtained from two-dimensional Fourier transformation of f with a difference image $\Delta F^k$ obtained from the two-dimensional Fourier transformation of $\Delta f^k$. Since the difference image contains only n phase encoding steps unequal to zero, the effect of intensity variation to be measured is represented with a low spatial resolution with respect to the original image F; however, the basic anatomic structures are shown with a high resolution. In the case of diffuse signal variations, like in the case of diffusion and perfusion studies, this method is often sufficient for making a sufficiently exact clinical diagnosis.

An improvement of spatial resolution and of variable signal information can be achieved at the expense of additional calculating work, namely, by using the information with a high spatial resolution during the data rework in a suitable manner. In this manner, in renewed reconstruction of images with a low spatial resolution, it is taken into consideration that the image points which lie within the object, i.e., having a signal intensity unequal to zero, are already known.

Figure 2A:
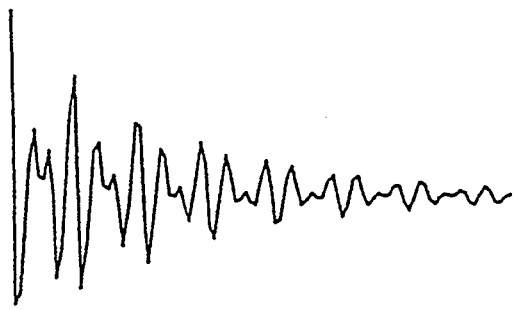
FIGS. 2(a)-(f) shows, in accordance with the present invention, a schematic representation of the "time-domain-adoption" for the reconstruction of an image line having a high resolution.
Figure 2B:
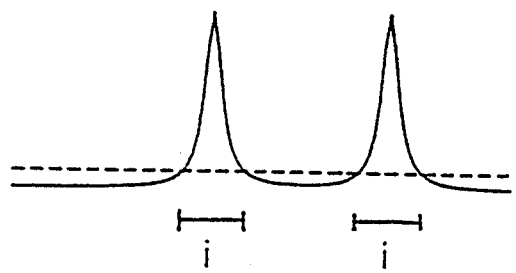
Figure 2C:
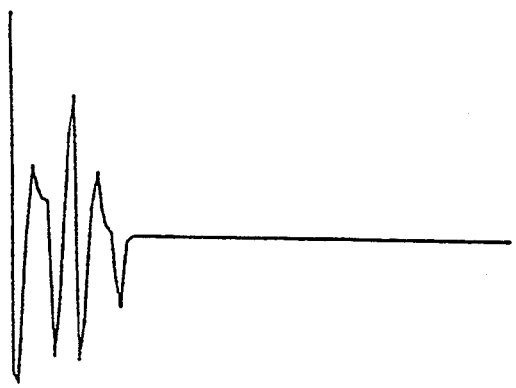
Figure 2D:
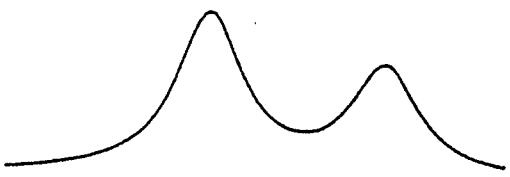
Figure 2E:
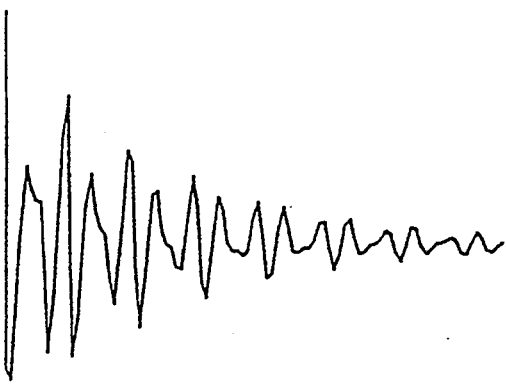
Figure 2F:
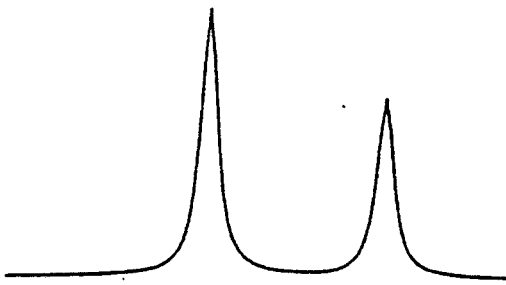

The relatively low spatial resolution of data $f'^k$ only occurs in one direction of the recorded image, i.e., in the direction of the phase encoding gradient $G_P$. Thus, back projection of data has to occur only in one dimension. This may occur line by line in that at first a line-by-line back transformation of a "time"-signal is generated by inverse Fourier transformation of the image F in lines in the phase encoding direction. FIG. 2a, according to the present invention, shows the "time"-signal obtained from the inverse Fourier transformation of an image line (FIG. 2b). This signal will consist of m points corresponding to the number of phase encoding steps. The same procedure is repeated for the image F generated by direct Fourier transformation, wherein the signal generated in this manner will contain merely n points unequal to zero according to the reduced number of phase encoding steps. The values of the $n^{th}$ to the $m^{th}$ point will be zero, as shown in FIGS. 2c and 2d. From the corresponding image line of F, those points of the examined cross-section which lie within the object observed (FIG. 2b) are known. The signal obtained from the line-by-line inverse Fourier transformation of F' is now adjusted as overlapping of the "time"-signals corresponding to the points within the object, i.e., the amplitudes of the time functions obtained from F are varied in such a manner that the "time"-signal corresponding to F' is adjusted in an optimum manner. In this connection only such "time"-signals are used which correspond to points lying within the object in F (see FIG. 2e). The sum of the error squares is to be used as adjustment criterion. The model function obtained in this manner is transformed by Fourier transformation into an image line with high spatial resolution as shown in FIG. 2f.

In an algorithm similar to the one described above, "frequency-domain fitting" can be carried out directly in the domain of the image, i.e., in the frequency domain with respect to the two-dimensional Fourier transformation. In this connection, first a "point-spread-function" with respect to the image is calculated with only n phase encoding steps for each point which is classified on the basis of the original image F as belonging to the object to be examined. The intensity of the point x is distributed on the neighboring points after imaging with a lower spatial resolution, such that the intensity $I_x$ which is contained in a point x is distributed over all points of a projection wherein, the equation $$\sum_{y=1}^{m} I_{yx} = \sum_{y=1}^{m} (a_{yx} \cdot I_x) = \left(\sum_{y=1}^{m} a_{yx}\right) \cdot I_x = I_x \quad (1)$$

must be met, where $I_{yx}$ represents the signal part from a point x in a point y of the projection which results as a product of the virtual intensity $I_x$ with the coefficient $a_{yx}$ resulting from the point-spread-function. This equation is valid for each point within the measuring volume. The measured signal intensity $i_y$ in a point y can thus be represented as the following sum $$i_y = \sum_{x=1}^{m} (a_{yx} \cdot I_x). \quad (2)$$

In the case of coefficients $a_{yx}$ known from the point-spread-function, the virtual intensities $I_y$ which are associated to each point can be calculated from the measured signal intensities. If no further assumption is made, this corresponds to the known deconvolution, in which case, the resolution of the deconvoluted projection has indeed improved, but the signal-to-noise ratio (S/R) is considerably worse than that of the original projection. However, if the result obtained from the first measurement is included in the calculation, from which it is known that only a small part of all points of a measured projection lie within the measuring volume, the number of coefficients is considerably reduced and the equation system obtained from equation (2) becomes considerably more stable with respect to noise. In this manner the spatial resolution of the resulting image can be considerably improved without an essential S/R loss.

In addition to the above-mentioned algorithms, also other algorithms, well-known by those with ordinary knowledge in the art of the present invention, can be used in accordance with the teachings of the present invention in reconstructions in the recording cycles with a high spatial resolution. Some well-known algorithms include maximum-entropy methods, and linear prediction.

Moreover, instead of the above-described gradient echo sequences, spin echo sequences or any other NMR recording sequences may be used with the method according to the present invention.

The present invention has been particularly shown and described with respect to certain preferred embodiments of features thereof. However, it should be readily apparent to those or ordinary skill in the art that various changes and modifications in form and detail may be made without departing from the spirit and scope of the invention as set forth in the appended claims. The invention illustratively disclosed herein may be practiced without any element which is not specifically disclosed herein.

What is claimed is:

1. A method of obtaining a time sequence of nuclear magnetic resonance (NMR) tomograms of a measuring volume comprising the steps of:
   a) selecting a sectional plane in the measuring volume;
   b) recording a high spatial resolution NMR tomogram data set f, having m members, $f_1 \ldots f_m$;
   c) recording a low spatial resolution NMR tomogram data set f' having n members, $f_1' \ldots f_n'$, with $n << m$;
   d) waiting a time $t_w$ after step c);
   e) repeating steps c) and d) in sequence to obtain k low spatial resolution data sets $f'^k$, each having n members, $f_1'^k \ldots f_n'^k$; and
   f) combining the high resolution data set f with the k low resolution data sets $f'^k$ to form k combined data sets $f''^k$ for reconstructing NMR tomograms of the sectional plane with high resolution in space and time.

2. The method of claim 1, wherein step f) comprises the step of directly supplementing the high resolution data set $f = f_1 \ldots f_n, f_{n+1} \ldots f_m$ by the difference data set $\Delta f^k = f_1'^k - f_1' \ldots f_n'^k - f_n, 0, 0, \ldots$ to obtain the k combined data sets $f''^k = f_1'^k \ldots f_n'^k, f_{n+1} \ldots f_m$.

3. The method of claim 1, wherein step f) comprises the step of time-domain fitting.

4. The method of claim 1, wherein step f) comprises the step of frequency-domain fitting.

5. The method of claim 1, wherein step f) comprises a step selected from the group consisting of a maximum-entropy reconstruction method and a linear prediction reconstruction method.

6. The method of claim 1, wherein steps b) and c) each comprise a step selected from the group consisting of a spin echo recording sequence and a gradient echo recording sequence.

7. A method of obtaining a time sequence of nuclear magnetic resonance (NMR) recordings comprising the steps of:
   a) selecting a measuring volume;
   b) recording a high spatial resolution NMR data set f having m members, $f_1 \ldots f_m$;
   c) recording a low spatial resolution NMR data set f' having n members, $f_1' \ldots f_n'$, with $n << m$;
   d) waiting time $t_w$;
   e) repeating steps c) and d) to obtain k low spatial resolution data sets $f'^k$, each having n members $f_1'^k \ldots f_n'^k$; and
   f) combining the high resolution data set f with the k low resolution data sets $f'^k$ to form k combined data sets $f''^k$ for reconstructing NMR recordings of the measuring volume with high resolution in space and time.

8. The method of claim 7, wherein step f) comprises the step of directly supplementing the high resolution data set $f = f_1 \ldots f_n, f_{n+1} \ldots f_m$ by the difference data set $\Delta f^k = f_1'^k - f_1' \ldots f_n'^k - f_n, 0, 0, \ldots$ to obtain the k combined data sets $f''^k = f_1'^k \ldots f_n'^k, f_{n+1} \ldots f_m$.

9. The method of claim 7, wherein step f) comprises the step of time-domain fitting.

10. The method of claim 7, wherein step f) comprises the step of frequency-domain fitting.

11. The method of claim 7, wherein step f) comprises a step selected from the group consisting of a maximum-entropy reconstruction method and a linear prediction reconstruction method.

12. The method of claim 7, wherein steps b) and c) each comprise a step selected from the group consisting of a spin echo recording sequence and a gradient echo recording sequence.

* * * * *